United States Patent
Rizzo

(10) Patent No.: US 6,559,511 B1
(45) Date of Patent: May 6, 2003

(54) NARROW GAP CLADDING FIELD ENHANCEMENT FOR LOW POWER PROGRAMMING OF A MRAM DEVICE

(75) Inventor: Nicholas D. Rizzo, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 34 days.

(21) Appl. No.: 10/010,574

(22) Filed: Nov. 13, 2001

(51) Int. Cl.[7] ............................................. H01L 29/82
(52) U.S. Cl. ....................................... 257/421; 257/414
(58) Field of Search ................................... 257/421, 108, 257/295; 365/158, 157, 171, 173

(56) References Cited

U.S. PATENT DOCUMENTS 5,075,247 A * 12/1991 Matthews
5,926,414 A * 7/1999 McDowell et al.

2001/0050859 A1 * 12/2001 Schwarzl

* cited by examiner

*Primary Examiner*—Nathan J. Flynn
*Assistant Examiner*—Kevin Quinto
(74) *Attorney, Agent, or Firm*—Willliam E. Koch

(57) ABSTRACT

A conductive line for programming a magnetoresistive memory device which includes a metal interconnect region positioned proximate to a magnetoresistive random access memory device, wherein the metal interconnect region supplies a current which produces a magnetic field and wherein the metal interconnect region includes a metal layer with a length and a width and has a first side, a second side, a third side, and a fourth side wherein a ferromagnetic cladding region with a thickness is positioned on the first side, the second side, the third side, and the fourth side of the metal layer, and wherein the ferromagnetic cladding region positioned on the first side has a trench having a length less than the length of the metal layer and a width approximately equal to the thickness of the ferromagnetic of the magnetic cladding region. The length of the trench can be changed to adjust the magnitude of the magnetic field.

10 Claims, 2 Drawing Sheets

NARROW GAP CLADDING FIELD ENHANCEMENT FOR LOW POWER PROGRAMMING OF A MRAM DEVICE

FIELD OF THE INVENTION

This invention relates to semiconductor memory devices. More particularly, the present invention relates to enhancing the magnetic field for programming semiconductor random access memory devices that utilize a magnetic field.

BACKGROUND OF THE INVENTION

A magnetoresistive random access memory (hereinafter referred to as "MRAM") device has a structure which includes ferromagnetic layers separated by non-ferromagnetic layers. The ferromagnetic layers each have a free magnetic moment vector that can be oriented in one of several preferred directions relative to a pinned magnetic moment vector that is fixed in direction.

Unique resistance values are created by the orientation of the free magnetic moment vector relative to the pinned magnetic moment vector. These unique resistance values are used to represent stored information. Accordingly, stored information is read by detecting resistance changes of the magnetic memory device. In typical magnetic memory devices, two resistance states are available. The stored states can be read by passing a sense current through the cell in a sense line to detect the difference between the magnetic resistances of the states.

In MRAM devices, the memory cells are programmed by magnetic fields produced by a current carrying conductor such as a copper interconnect. Typically, two orthogonal interconnects are employed, with one positioned above (hereinafter referred to as the bit line) the MRAM device and the second positioned below (hereinafter referred to as the digit line) the MRAM device. The purpose of the bit and digit lines is to provide magnetic fields for programming the MRAM device.

A problem with programming a MRAM device is the large current required to produce a magnetic field of sufficient magnitude. This is especially a problem for low power applications, such as laptop computers, cell phones, pagers, and other portable electronic devices. In addition, as the magnetic memory cell is reduced in size to increase the areal density of the memory, the magnetic field required for programming of the ferromagnetic free layer must be increased to maintain the stability of the memory state against thermal fluctuations. Further, a MRAM device integrates magnetic memory elements and other circuits, for example, a control circuit for magnetic memory elements, comparators for detecting states in a magnetic memory element, input/output circuits, etc. These circuits are usually fabricated in the process of CMOS technology, which operates at low current and high efficiency, in order to lower the power consumption of the system.

In the prior art, the bit lines and digit lines are typically surrounded by a ferromagnetic cladding region to focus the magnetic field towards the MRAM device. For an uncladded conductive line, the magnetic field is given by the equation $H \sim I/2.w$, where I is the current flowing through the conductive line and w is the width of the conductive line. For simplicity of discussion, we are ignoring the magnetic field loss caused by the finite distance between the bit and the conductive line, as well as the field loss caused by the finite thickness of the conductive line. However, for a conductive line cladded on three sides, the magnetic field is given by the equation $H \sim I/w$, which is a factor of two larger than the uncladded bit line. Hence, the magnetic field of a conductive line can be increased for a given current by adding a ferromagnetic cladding region. Thus, by adding the ferromagnetic cladding region, it is possible to program MRAM devices with less current. However, further reductions in current are desired so that MRAM devices are more compatible with CMOS technology.

It would be highly advantageous, therefore, to remedy the foregoing and other deficiencies inherent in the prior art.

Accordingly, it is an object of the present invention to provide a new and improved magnetoresistive random access memory device.

It is an object of the present invention to provide a new and improved magnetoresistive random access memory device which reduces power consumption of the device.

It is a further object of the present invention to provide a new and improved magnetoresistive random access memory device which is more compatible with CMOS technology.

It is another object of the present invention to provide a new and improved magnetoresistive random access memory device which operates at currents typically produced by CMOS technology.

SUMMARY OF THE INVENTION

To achieve the objects and advantages specified above and others, a conductive line for programming a MRAM device is disclosed which includes a metal interconnect region, wherein the metal interconnect region is capable of supplying a current which produces a magnetic field. The metal interconnect region includes a metal layer with a thickness and a width and has a first side, a second side, a third side, and a fourth side wherein a ferromagnetic cladding region with a thickness is positioned on the first side, the second side, the third side, and the fourth side of the metal layer. Further, the ferromagnetic cladding region positioned on the first side has a trench having a width, g, which is less than the width, w, of the metal layer and a depth approximately equal to the thickness of the ferromagnetic cladding region. The trench within the ferromagnetic cladding region is positioned adjacent to a magnetoresistive random access memory device. The purpose of the trench is to concentrate the magnetic field proximate to the magnetoresistive random access memory device, wherein the magnetic field is increased by a factor approximately equal to w/g, the width of the metal layer divided by the width of the trench.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
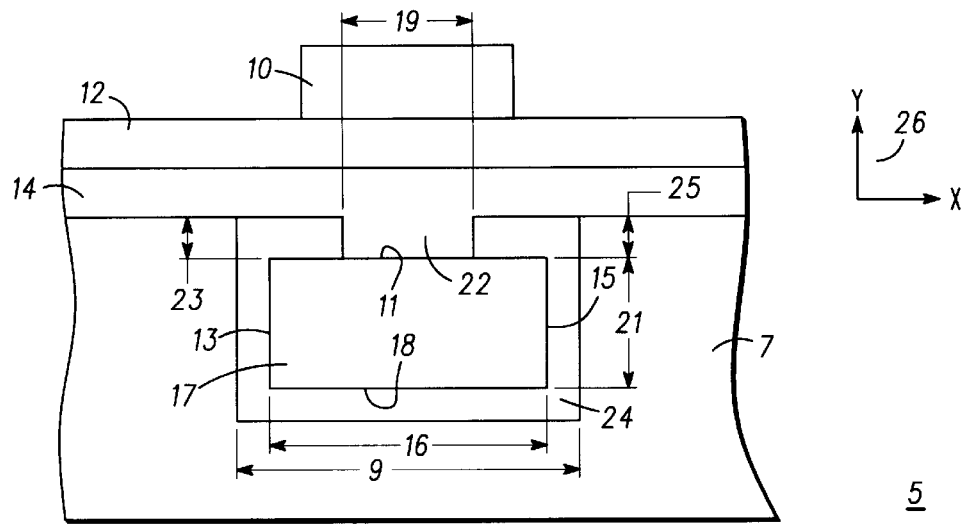
FIG. 1 is a simplified sectional view illustrating a conductive line in accordance with the present invention.

Turn now to FIG. 1, which illustrates a simplified sectional view of a conductive line 5 for programming a MRAM device 10 in accordance with the present invention. Conductive line 5 includes a metal interconnect region 9 positioned proximate to MRAM device 10 and formed within a substrate 7, wherein the metal interconnect region 9 is capable of supplying a current which produces a magnetic field for switching MRAM device 10. An x-y coordinate system 26 is used as a reference for the present discussion. In this embodiment, MRAM device 10 is supported on a dielectric interlayer 14 and a metal contact layer 12, which connects MRAM device 10 to a transistor (not shown). It will be understood that metal interconnect region 9 can be positioned in other configurations relative to MRAM device 10 such that the magnetic field produced by the current in metal interconnect region 9 is sufficient to program MRAM device 10.

Metal interconnect region 9 includes a metal layer 17 which has a width 16 and a thickness 21 and also has a first side 11, a second side 13, a third side 15, and a fourth side 18. In the preferred embodiment, metal layer 17 includes copper, but it will be understood that metal layer 17 can include other metals, such as aluminum, silver, gold, platinum, or another suitable conductive material. Typically, metal layer 17 is deposited by physical vapor deposition (hereinafter referred to as PVD) and plating or another suitable deposition technique.

A ferromagnetic cladding region 24 with a thickness 23 is positioned on first side 11, second side 13, third side 15, and fourth side 18 of metal layer 17. Ferromagnetic cladding region 24 positioned on first side 11 has a trench 22 having a width 19 which is less than width 16 of metal layer 17. Further, trench 22 has a depth 25 approximately equal to thickness 23 of ferromagnetic cladding region 24. Ion milling can be used to create trench 22 and a spacer layer may also be needed.

In the preferred embodiment, ferromagnetic cladding region 24 includes ferromagnetic materials that have high magnetic permeability, such as NiFeCo alloys. With a high permeability, the cladding magnetization rotates in response to an applied magnetic field which enables the magnetic flux focusing and magnetic field enhancement of the ferromagnetic cladding region. While a rectangular metal layer is illustrated and described it will be understood that other forms or shapes could be used and all such forms or shapes will incorporate the described sides, and will include a width and a depth. Further, the forming of the various layers included in metal interconnect region 9 can be formed using other semiconductor patterning and etching techniques well known to those skilled in the art.

In this specific embodiment, MRAM device 10 is a standard MRAM bit formed according to well-known practices in the art. While a standard MRAM bit is illustrated herein for convenience, it will be understood by those skilled in the art that many other types of devices could be provided. Also, while a single MRAM bit is illustrated for convenience it should be understood that, for example, a complete array of devices or control/driver circuits around the periphery of an array of magnetic memory bits may be formed.

For ease of discussion, a digit line not in physical contact with the magnetic memory bit is discussed in reference to FIG. 1. However, it should be understood that while the drawings illustrate a digit line not in physical contact with the magnetic memory bit, that it is also anticipated by this disclosure to form a digit line that is in physical contact with the magnetic memory bit. Thus, it will be understood that in an alternative embodiment, physical contact is made between MRAM device 10 and a magnetically coupled digit line.

Ferromagnetic cladding region 24 can be formed by etching a trench in substrate 7 using standard semiconductor patterning and etching techniques. Also, ferromagnetic cladding region 24 is illustrated as a single layer, but it will be understood that ferromagnetic cladding region 24 can include a plurality of layers. For example, it is well known to those skilled in the art that a metal layer/ferromagnetic layer/metal layer can be used as an effective cladding layer, wherein the metal layers can include platinum, palladium, ruthenium, rhodium, rhenium, iridium, tantalum, combinations thereof or another suitable conductive material and the ferromagnetic layer can include nickel iron (NiFe). However, ferromagnetic cladding region 24 is illustrated as including one layer of a ferromagnetic material, such as NiFe, in this embodiment for simplicity.

Conductive line 5 in FIG. 1 illustrates a metal interconnect region 9 positioned below MRAM device 10. Metal interconnect region positioned thus is often referred to as a digit line. However, it will be understood that another metal interconnect region could be formed using standard semiconductor processes well know to those skilled in the art positioned above MRAM device 10 in a similar manner and be referred to as a bit line. Further, a bit line can be formed using a self-aligned process as will be discussed presently. Also, it will be understood that this is a simplified view that only shows the areas of interest, and in particular metal interconnect region 9. Further, in this embodiment, the metal layers are illustrated as being stacked on MRAM device 10, but it will be understood that the metal layers can be positioned in other configurations relative to MRAM device 10 wherein the metal layers supply a large enough magnetic field to program MRAM device 10.

Figure 2:
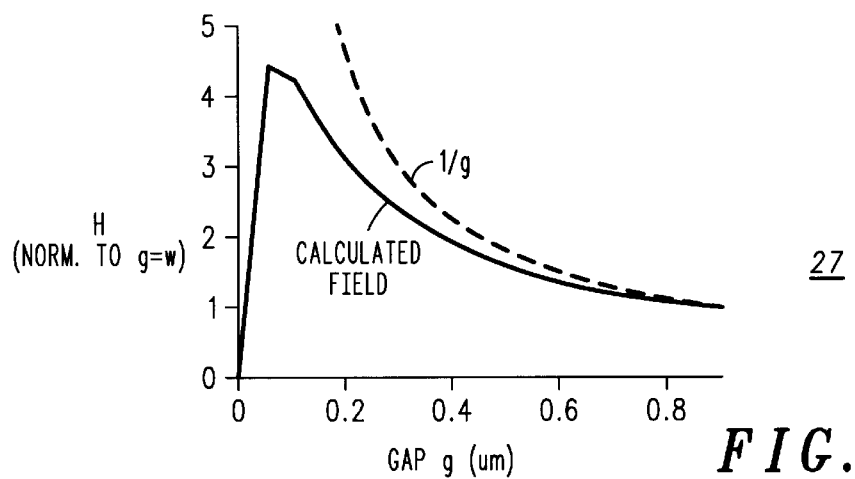
FIG. 2 is a plot illustrating the magnitude of the magnetic field verses the width of the trench within the ferromagnetic cladding region at a distance from the conductive line.

Turn now to FIG. 2 which illustrates a plot 27 of the magnitude of the magnetic field in the x-direction, as referenced to x-y coordinate system 26 (See FIG. 1) verses width 19. The data in Plot 27 was generated using a numerical magnetostatic solver assuming that width 16 is equal to 0.9 $\mu$m and thickness 21 is equal to 0.4 $\mu$m. In addition, the ferromagnetic cladding region 24 includes $Ni_{80}Fe_{20}$ and thickness 23 is assumed to be equal to 25 nm. Further, plot 27 illustrates the magnitude of the magnetic field at a point 0.15 $\mu$m above metal layer 17 and over the center of metal layer 17 with a current of 4 mA. Also, plot 27 is normalized to width 16 such that the magnitude of the magnetic field is assumed to be one when width 16 is equal to width 19. Hence, width 19 is adjusted to choose the magnitude of the magnetic field. The magnetic field is increased by a factor approximately equal to width 16 divided by width 19. Thus, Plot 27 illustrates that the magnitude of the magnetic field can be increased by decreasing width 19.

Thus, conductive line 5 reduces the current and power needed to program MRAM device 10 since the magnitude of the magnetic field is increased by decreasing width 19. Trench 22 in ferromagnetic cladding region 24 tends to concentrate the magnetic flux in a smaller area so that the magnetic field magnitude increases. Hence, MRAM device 10 is more compatible with the low currents typically produced by CMOS technology.

Figure 3:
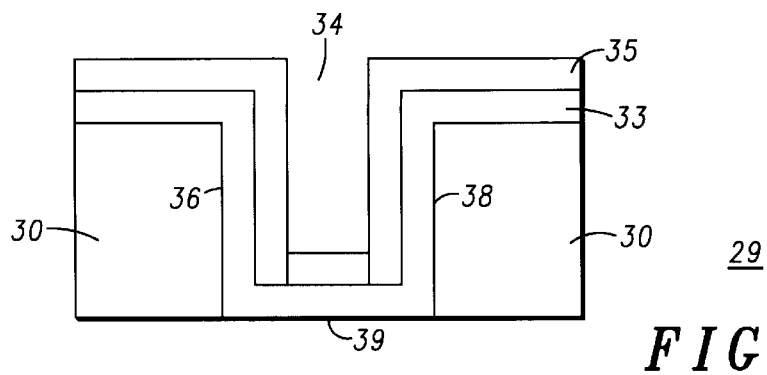
FIGS. 3, 4, 5, and 6 are simplified sectional views illustrating sequential steps in a process of fabricating a metal interconnect region positioned above a memory bit.
Figure 4:
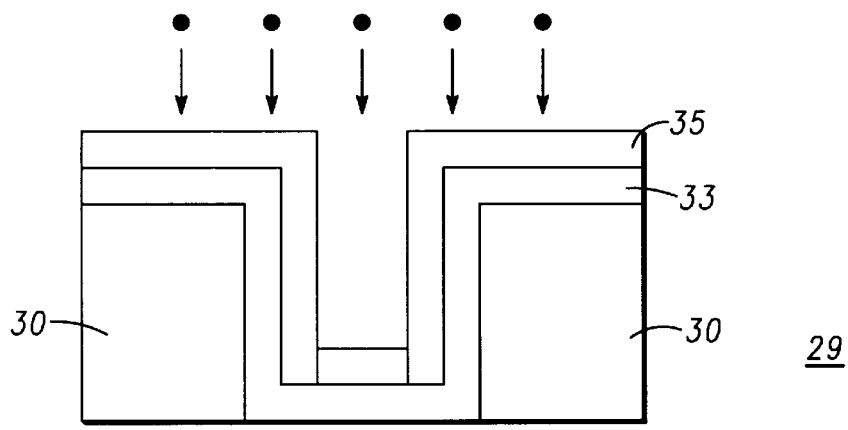
Figure 5:
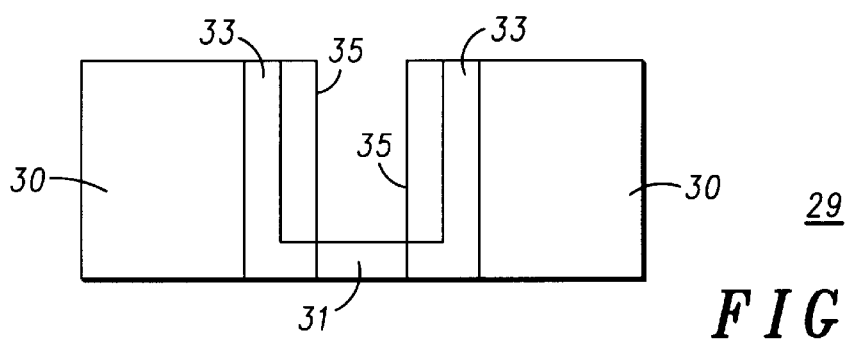

One embodiment of fabricating the conductive line for programming a magnetoresistive memory device is discussed hereinafter and illustrated in FIGS. 3, 4, 5, and 6. Turning now to FIG. 3, the method of fabrication includes the steps of providing an interconnect forming layer 30, patterning and etching a trench 34 within interconnect forming layer 30 wherein trench 34 has a bottom 39, a first side 36, and a second side 38. Trench 34 can be formed using dry etching, wet etching, or other suitable etching processes well known to those skilled in the art. Also, it will be understood that the conductive line could be formed in other embodiments by standard photolithography and etching.

A ferromagnetic cladding region 33 is deposited within trench 34 and positioned on bottom 39, first side 36, and second side 38 of trench 34. Further, a spacer layer 35 is positioned on ferromagnetic cladding region 33 within trench 34. Spacer layer 35 can include silicon oxide, silicon nitride, or another suitable material. Spacer layer 35 is then ion milled (See FIG. 4) within trench 34 and through spacer layer 35 and ferromagnetic cladding region 33 positioned on bottom 39 to interconnect forming layer 30 to create a trench or gap 31 within ferromagnetic cladding region 33 (See FIG. 5). It will be understood that ion milling is an example of an anisotropic etch technique and that other anisotropic etching techniques that have chemical or reactive components may also be used.

Figure 6:
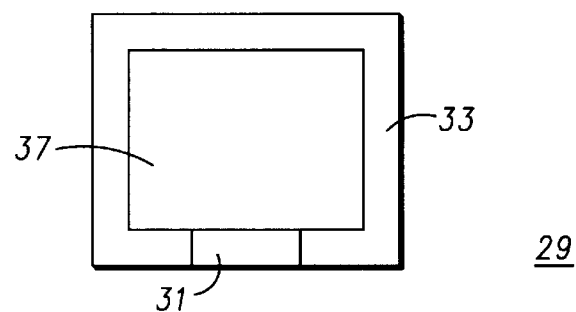

Spacer material 35 from within trench 34 is removed and a conductive material 37 is deposited within trench 34 and adjacent to ferromagnetic cladding layer 33 within trench 34 (See FIG. 6). Conductive material 37 can be formed using electrochemical deposition or another suitable deposition technique. Ferromagnetic cladding region 33 is then formed on conductive material 37. In this embodiment, MRAM device 10 would be positioned below conductive material 37 and adjacent to gap 31, however, gap 31 can be positioned otherwise depending on the relative placement of MRAM device 10. This embodiment has the particular advantage that the gap in the ferromagnetic cladding region is self-aligned to the etched trench.

In a variation of the self-aligned embodiment discussed with reference to FIGS. 3, 4, 5, and 6, the ferromagnetic cladding region is deposited only on bottom 39 of trench 34 using an anisotropic film deposition. Gap 31 in ferromagnetic cladding region 33 is then patterned as before using a spacer layer and an anisotropic etch. Further, the spacer is removed after the anisotropic etch and conductive material 37 which has four sides is formed using electrochemical deposition or another suitable deposition technique. Interconnect forming layer 30 surrounding conductive material 37 is then removed to expose conductive material 37 and ferromagnetic cladding region 33 is then positioned on conductor material 37 such that ferromagnetic cladding region 33 surrounds conductive material 37 and has gap 31 positioned adjacent to bottom 39. Ferromagnetic cladding region 33 can be deposited using electrochemical deposition or PVD combined with a subtractive etch to remove the magnetic material between adjacent bit lines. Electrochemical deposition has the advantage of being self-aligned to ferromagnetic cladding region 33 and to the conductive material 37 and eliminates the need for expensive photolithography steps. Further, electroplating has the advantage of allowing a high aspect ratio when depositing a material in a trench.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A conductive line for programming a magnetoresistive memory device comprising:

an electrically conductive interconnect region positioned proximate to a magnetoresistive random access memory device and wherein the interconnect region is formed within a substrate, wherein the interconnect region is capable of conducting a current for producing a magnetic field and wherein the interconnect region includes a conductive layer with a thickness and a width and has a first side, a second side, a third side, and a fourth side;

a ferromagnetic cladding region with a thickness positioned on the first side, the second side, the third side, and the fourth side of the conductive layer; and the ferromagnetic cladding region positioned on the first side defining a trench having a width less than the width of the conductive layer and a depth approximately equal to the thickness of the ferromagnetic cladding region.

2. A conductive line for programming a magnetoresistive memory device as claimed in claim 1 wherein the ferromagnetic cladding region includes at least one layer containing Ni, Fe, or Co, combinations thereof, and another suitable ferromagnetic material.

3. A conductive line for programming a magnetoresistive memory device as claimed in claim 1 wherein the ferromagnetic cladding region includes at least one layer of platinum, palladium, ruthenium, rhodium, rhenium, iridium, tantalum, combinations thereof, and another suitable conductive material.

4. A conductive line for programming a magnetoresistive memory device as claimed in claim 1 wherein the conductive layer includes one of copper, aluminum, platinum, gold, silver, and another suitable conductive material.

5. A conductive line for programming a magnetoresistive memory device comprising:

at least one of a metal interconnect bit and digit region positioned proximate to a magnetoresistive random access memory device, the metal interconnect bit and digit regions being capable of supplying a current which produces a magnetic field and wherein the metal interconnect bit and digit regions include a conductive layer with a length and a width and a first side, a second side, a third side, and a fourth side;

a ferromagnetic cladding region with a thickness positioned on the first side, the second side, the third side, and the fourth side of the conductive layer; and the ferromagnetic cladding region positioned on the first side defining a gap having a width less than the width of the conductive layer and a depth approximately equal to the thickness of the ferromagnetic cladding region, and wherein the gap is positioned adjacent to the magnetoresistive random access memory device, the magnetic field being increased by a factor approximately equal to the width of the conductive layer divided by the width of the gap in the ferromagnetic cladding region.

6. A conductive line for programming a magnetoresistive memory device as claimed in claim 5 wherein the conductive layer includes one of copper, aluminum, silver, gold, platinum, and another suitable conductive material.

7. A conductive line for programming a magnetoresistive memory device as claimed in claim 5 wherein the ferromagnetic cladding region includes at least one layer containing Ni, Fe, or Co, combinations thereof, and another suitable ferromagnetic material.

8. A conductive line for programming a magnetoresistive memory device as claimed in claim 5 wherein the ferromagnetic cladding region includes at least one layer of platinum, palladium, ruthenium, rhodium, rhenium, iridium, tantalum, combinations thereof, and another suitable conductive material.

9. A conductive line for programming a magnetoresistive memory device comprising:

an electrically conductive interconnect region positioned proximate to a magnetoresistive random access memory device, wherein the interconnect region is capable of conducting a current for producing a magnetic field and wherein the interconnect region includes a conductive layer with a thickness and a width and has a first side, a second side, a third side, and a fourth side;

a ferromagnetic cladding region with a thickness positioned on the first side, the second side, the third side, and the fourth side of the conductive layer; and the ferromagnetic cladding region positioned on the first side defining a trench having a width less than the width of the conductive layer and a depth approximately equal to the thickness of the ferromagnetic cladding region, the width of the trench in the ferromagnetic cladding region being chosen to provide a desired magnitude of the magnetic field.

10. A conductive line for programming a magnetoresistive memory device comprising:

an electrically conductive interconnect region positioned proximate to a magnetoresistive random access memory device, wherein the interconnect region is capable of conducting a current for producing a magnetic field and wherein the interconnect region includes a conductive layer with a thickness and a width and has a first side, a second side, a third side, and a fourth side;

a ferromagnetic cladding region with a thickness positioned on the first side, the second side, the third side, and the fourth side of the conductive layer; and the ferromagnetic cladding region positioned on the first side defining a trench having a width less than the width of the conductive layer and a depth approximately equal to the thickness of the ferromagnetic cladding region, the magnetic field being increased by a factor approximately equal to the width of the metal layer divided by the width of the trench in the ferromagnetic cladding region.

* * * * *

UNITED STATES PATENT AND TRADEMARK OFFICE
CERTIFICATE OF CORRECTION

PATENT NO. : 6,559,511 B1  
DATED : May 6, 2003  
INVENTOR(S) : Rizzo

It is certified that error appears in the above-identified patent and that said Letters Patent is hereby corrected as shown below:

<u>Column 1,</u>
Line 4, please add:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN  
*Director of the United States Patent and Trademark Office*